United States Patent

Bareither

[11] Patent Number: 5,831,806
[45] Date of Patent: Nov. 3, 1998

[54] PROTECTIVE CIRCUIT FOR BICMOS/CMOS CIRCUITRY IN HYBRID VCC SYSTEMS DURING H OPERATION

[75] Inventor: Juergen Bareither, Tiefenbach, Germany

[73] Assignee: Texas Instruments Incorporated, Dallas, Tex.

[21] Appl. No.: 788,536

[22] Filed: Jan. 24, 1997

[30] Foreign Application Priority Data

Jan. 24, 1996 [DE] Germany ........................ 196 02 456.0

[51] Int. Cl.$^6$ ....................................................... H02H 3/20
[52] U.S. Cl. ................................................ 361/91; 361/18
[58] Field of Search .................................... 361/18, 56, 86, 361/88, 90, 91, 111; 362/80, 81, 84–86, 73, 58

[56] References Cited

FOREIGN PATENT DOCUMENTS

| | | | |
|---|---|---|---|
| 0 630 109 A | 12/1994 | European Pat. Off. ... | H03K 19/0175 |
| WO 94 29963 A | 12/1994 | WIPO ........................ | H03K 19/0185 |
| WO 95 08219 A | 3/1995 | WIPO ........................... | H03K 19/003 |

*Primary Examiner*—Ronald W. Leja
*Attorney, Agent, or Firm*—William B. Kempler; Richard L. Donaldson

[57] ABSTRACT

The present invention relates to a protective circuit for BiCMOS/CMOS circuitry in hybrid VCC systems during H operation. The object of the invention is to create such a protective circuit, which has the least possible influence on the circuitry employing it and only takes up a small amount of space. In order to attain such aim a protective circuit monitors the voltage (VOH) present at its output (AUS) by comparison with a predetermined voltage (REF) and when such predetermined voltage is exceeded it terminates H operation. The protective circuit is so designed that it only taps a negligible monitoring current component (Iex') from the output (AUS).

9 Claims, 2 Drawing Sheets

PROTECTIVE CIRCUIT FOR BICMOS/CMOS CIRCUITRY IN HYBRID VCC SYSTEMS DURING H OPERATION

The present invention relates to a protective circuit for BiCMOS/CMOS circuitry in hybrid VCC systems during H operation.

Hybrid VCC systems are well known in the prior art. In such systems at least two different H levels, as for example 3.3 V and 5 V are supplied to a bus by two suitable components with different BiCMOS/CMOS circuits.

In the majority of hybrid VCC systems a protective circuit is called for in H operation for the protection of components with a low power consumption.

The reasons for this will now be explained with reference to FIG. 2 in detail. FIG. 2 shows a part of an output stage of a BiCMOS/CMOS circuit of a prior art hybrid VCC system.

In FIG. 2 MP4 denotes a PMOS output transistor having the function in its conducting state of supplying an H level, for example of 3.3 V, from its source terminal, the output AUS of the circuit, to a bus (not illustrated). The drain terminal of the PMOS output transistor MP4 is connected with a first supply potential VCC, which is selected in accordance with the H level to be supplied to the bus.

Between the output AUS and the gate terminal of the PMOS output transistor MP4 there is the principal current path of a PMOS transistor MP7, whose gate terminal is connected with the first supply potential VCC.

Furthermore the output AUS is connected via the principal current path of a PMOS transistor MP8 with the substrates of the PMOS transistors MP4, MP7 and MP8. The substrates are for their part connected via a Schottky diode D1 with the first supply potential VCC, said Schottky diode D1 being so placed in circuit that it prevents the flow of current toward VCC. At the gate terminal of the PMOS transistor MP8 VCC is also present.

The two PMOS transistors MP7 and MP8 have the function of preventing turning on of the PMOS output transistor MP4, when output of the H level from the PMOS output transistor MPA to the bus is disenabled because its gate terminal is connected to VCC.

Such turning on might otherwise in fact occur, if a further component were to apply 5 V to the bus so that the voltage VOH at the output AUS wind become 5 V and greater than the voltage VCC, which is equal to 3.3 V, at the gate or, respectively, substrate of the PMOS output transistor MP4.

This effect is opposed by the PMOS transistors MP7 and MP8 because, at the voltages at the output AUS, which are greater than VCC+VtMP7 or, respectively, VCC+VtMP8, they are turned on in order to cause the gate or, respectively, substrate potential from the PMOS output transistor MP4 to wax with the voltage VOH at the output AUS. VtMP7 and VtPM8 are the threshold voltages of the PMOS transistors MP7 and respectively MP8.

In this connection it is to be noted that a corresponding lower third and, respectively, fourth supply potential VCC–VtMP7 and, respectively, VCC–VtMP8 may also be present at the gate terminals of MP7 and, respectively, MP8 in order to render possible turning on of the PMOS transistors MP7 and MP8 exactly at VCC.

Moreover a driver circuit is provided for the selective connection of the gate terminal of the PMOS output transistor MP4 with a second supply potential GND (here for instance ground potential) in order at the output AUS to produce an H level or with the first supply potential VCC to produce an L level at the output AUS.

This driver circuit comprises the following components: PMOS transistors MP1 and MP2, NMOS transistors MN2 and MN3, a pnp bipolar transistor Q1 and Schottky diodes D2 and D3.

The PMOS transistor MP2 has a drain terminal connected with the first supply potential VCC and a source terminal connected via the Schottky diode D3 with the gate terminal of the PMOS output transistor MP4. At its gate terminal the PMOS transistor MP2 gets an input signal EIN.

The gate terminal of the PMOS output transistor MP4 is furthermore connected via the NMOS transistors MN2 and MN3, placed in series with one another, with the second supply potential GND, which here is for example ground potential.

At its gate terminal the NMOS transistor MN3 gets the input signal EIN, which turns on the NMOS transistor MN3, when the signal is in the H state.

The MNOS transistor MN2 is connected via a Schottky diode D2 with the source terminal of the PMOS transistor MP1, whose drain terminal is connected with the first supply potential VCC. The MOS transistors MP1 and MN2 get an enabling signal NCTRL at their gate terminal, said signal turning off the PMOS transistor MP1 and turning on the NMOS transistor MN2, if such signal is in the H state.

The pnp bipolar transistor Q1 serves to shunt the PMOS transistor MP1 in a fashion dependent the complement CTRL of the enabling signal NCTRL at its base terminal.

In the condition in which EIN is equal to "H" and NCTRL is equal to "H" and accordingly CTRL is equal to "L", there will be the H state at the output AUS, for the gate terminal of the PMOS output transistor MP4 is then connected with ground via the two NMOS transistors MN2 and MN3 and the PMOS output transistor MP4 is accordingly turned on.

In the "L" state of NCTRL and accordingly the "H" state of CTRL or when EIN is "L", the gate terminal of the PMOS output transistor MP4 is supplied with the first supply potential VCC via the bipolar transistor Q1 and the Schottky diode D2 or via the PMOS transistor MP2 and the Schottky diode D3, with the result that the PMOS output transistor MP4 is turned off. Then again the Schottky diodes D2 and D3 prevent the flow of current toward VCC Let it now be supposed that the voltage VOH at the output AUS in the H state, i.e. with the PMOS output transistor MP4 turned on by the driver circuit, it becomes greater than the voltage VCC (3.3 V) sent by it to the bus, namely because a further component, connected with the bus, supplies, in its H state VCC (=5 V), to the bus.

Then a corresponding current Iex will flow via the PMOS output transistor MP4. If the voltage VOH at the output AUS continues to increase and becomes larger than VCC+VtMP7, then the PMOS transistor MP7 will be turned on, and an additional current component will flow from the output AUS via the transistors MP7, MN2 and MN3 to ground.

The current Iex so produced may damage components with a low power consumption and represent a substantial load on the power supply of the system. These problems may be only dealt using suitable protective circuitry.

Conventional protective circuits do however suffer from two substantial disadvantages, namely firstly that they impair function of the circuit employing them, as for instance the response behavior, and secondly they have a substantial space requirement and accordingly hinder progressive integration of such circuitry.

One object of the present invention is accordingly to create such a protective circuit, which has the least possible influence on the circuitry employing same and only takes up a small amount of space.

In accordance with the invention this aim is to be attained by a protective circuit for a BiCMOS/CMOS circuit in hybrid VCC systems during H operation, the BiCMOS/CMOS circuit comprising: a first MOS transistor, whose drain terminal is connected with a first supply potential, whose source terminal constitutes the output of the BiCMOS/CMOS circuit and possesses a gate terminal; a driver circuit, which is connected with the gate terminal of the first MOS transistor for selective connection of the gate terminal of the first MOS transistor with the first supply potential in order to produce an L level at the output, or with a second supply potential in order during H operation to produce an H level at the output; and a second MOS transistor, whose principal current path is between the output and the gate terminal of the first MOS transistor and whose gate terminal is connected with a third supply potential to short circuit the output with the gate terminal of the first MOS transistor, when the voltage at the output exceeds a predetermined value, characterized by a third MOS transistor, whose principal current path is between the first supply potential and the gate terminal of the first MOS transistor and which possesses a gate terminal; a fourth MOS transistor, whose principal current path is in series with the driver circuit between the gate terminal of the first MOS transistor and the second supply potential and which possesses a gate terminal; and a protective circuit triggering circuit for getting the voltage at the output and for limiting the monitoring current component then tapped from the output, for comparison of the voltage at the output with a predetermined reference voltage, and for causing output of a triggering signal during H operation, when the voltage at the output is larger than the reference voltage in order to so to turn on the third MOS transistor and to turn off the fourth MOS transistor.

It is preferred for the protective circuit of the invention to be further characterized in that the output is connected via the principal current path of a fifth MOS transistor with the substrates of the first, second and fifth MOS transistors, the substrates being connected with the first supply potential and a fourth supply potential being present at the gate terminal of the PMOS transistor.

It is preferred for the protective circuit of the invention to be further characterized in that a Schottky diode is placed between the first supply potential and the substrates, such Schottky diode being so placed in circuit that it prevents any flow of current to the first supply potential.

It is preferred for the protective circuit of the invention to be further characterized in that the driver circuit comprises: a sixth MOS transistor, whose principal current path is between the first supply potential and the gate terminal of the first MOS transistor and which possesses a gate terminal for getting an input signal, seventh and eighth MOS transistors placed in series with one another, and which on the one hand are connected with the gate terminal of the first MOS transistor and on the other hand via the fourth MOS transistor with the second supply potential, the eighth MOS transistor getting the input signal at its gate terminal and the seventh MOS transistor getting an enabling signal at its gate terminal; a ninth MOS transistor, whose principal current path is between the gate terminal of the first MOS transistor and the first supply potential; and a bipolar transistor for shunting the ninth MOS transistor in a fashion dependent the complement of the enabling signal at the base terminal thereof.

It is preferred for the protective circuit of the invention to be further characterized in that between the gate terminal of the first MOS transistor and the ninth MOS transistor a Schottky diode is placed, which prevents the flow of current toward the first supply potential.

It is preferred for the protective circuit of the invention to be further characterized in that between the sixth MOS transistor and the gate terminal of the first MOS transistor a Schottky diode is placed which prevents the flow of current toward the first supply potential.

It is preferred for the protective circuit of the invention to be further characterized in that between the third MOS transistor and the gate terminal of the first MOS transistor a Schottky diode is placed which prevents the flow of current toward the first supply potential.

It is preferred for the protective circuit of the invention to be further characterized in that the protective circuit triggering circuit comprises: a tenth MOS transistor, whose source terminal is connected with the output and whose gate terminal gets a reference voltage, an eleventh MOS transistor, whose drain terminal is connected with the drain terminal of the tenth MOS transistor and whose gate terminal gets the enabling signal; a resistor, which is connected with the source terminal of the eleventh MOS transistor and with the second supply potential; an inverter, whose input terminal is connected with a node placed between the source terminal of the eleventh MOS transistor and the resistor, and whose output terminal is connected with the gate terminals of the third and of the fourth MOS transistors.

It is preferred for the protective circuit of the invention to be further characterized in that the substrate of the tenth MOS transistor is connected via a Schottky diode with the first supply potential, said Schottky diode being so placed in circuit that it prevents any flow of current toward the first supply potential.

A particularly advantageous feature of the protective circuit of the invention is that both the switching off current and also the turning off voltage may be precisely set, that the circuit needs little space and that it does not have a disadvantageous effect on the response behavior of the circuitry incorporating it.

In the following the invention will be described in detail with reference to a preferred embodiment, which is represented in the accompanying drawings.

Figure 1:
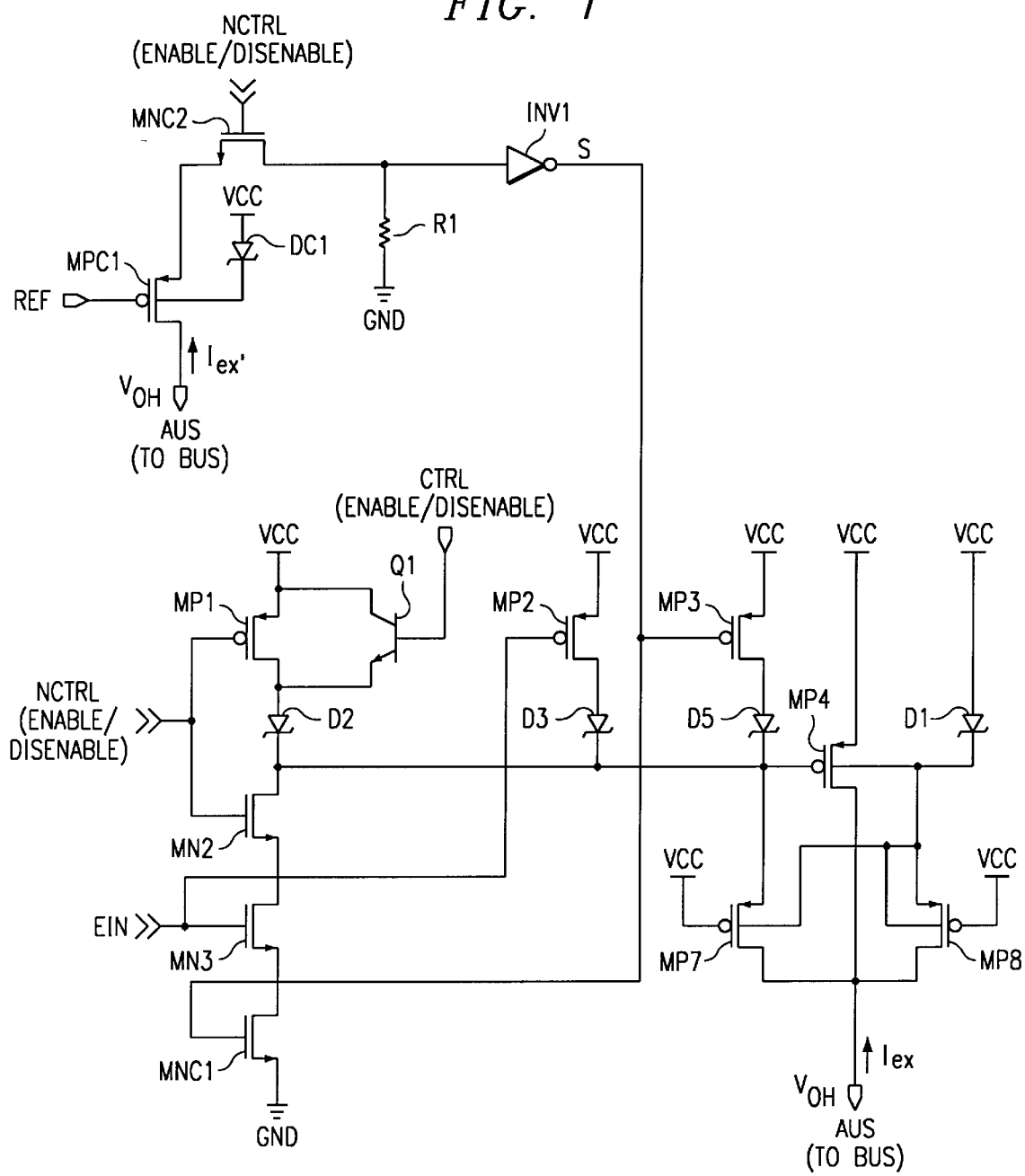
FIG. 1 shows a preferred embodiment of the protective circuit in accordance with the invention for BiCMOS/CMOS circuits in hybrid VCC systems during H operation, same being utilized in the output stage part depicted in FIG. 2.

The use of the protective circuit of the invention for BiCMGS/CMOS circuits in hybrid VCC systems in H operation is depicted in FIG. 1.

Figure 2:
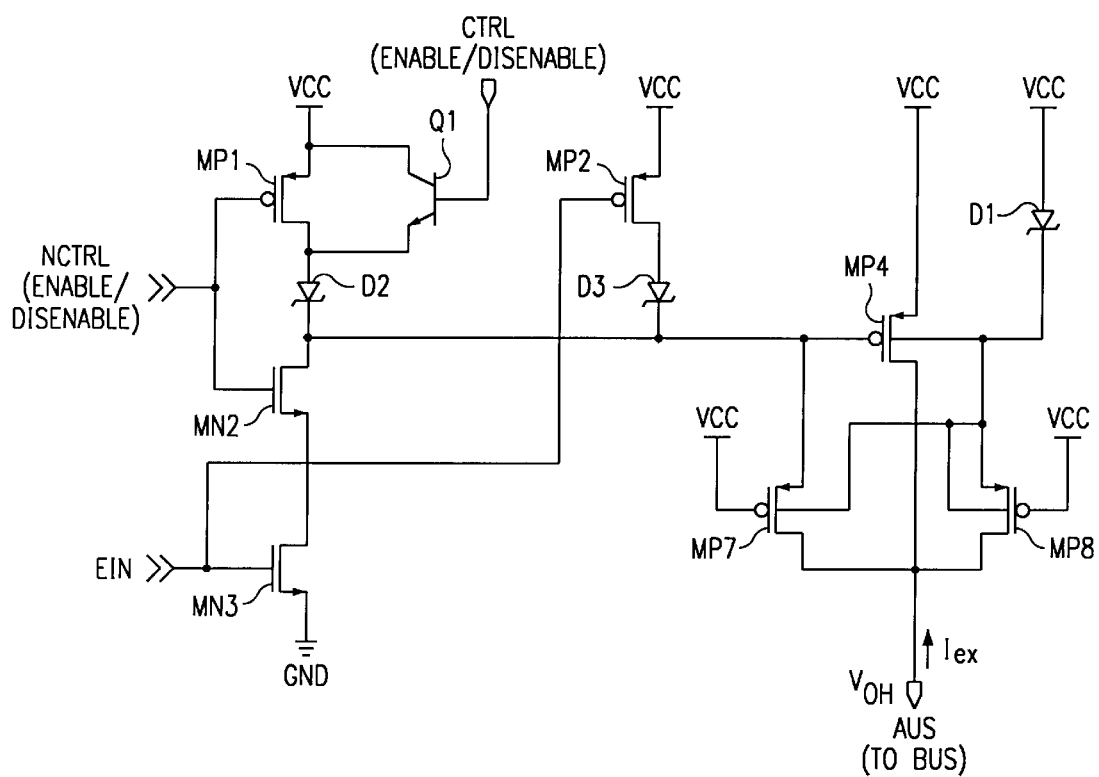
FIG. 2 shows a part of an output stage of a BiCMOS/CMOS circuit of a hybrid VCC system in accordance with the prior art.

In FIG. 1 parts which are the same as those in FIG. 2 are provided with the same reference numerals in order to avoid repetition of the description of such parts.

The protective circuit of the invention comprises three main components.

Firstly an additional PMOS transistor MP3 is provided, whose drain terminal is connected with a first supply potential VCC and whose source terminal is connected via a Schottky diode D5, which is to prevent flow of current toward VCC, with the gate terminal of the PMOS output transistor MP4.

Moreover an NMOS transistor MNC1 is provided connected so that its principal current path is placed between the NMOS transistor MN3 and the second supply potential GND (here for example ground potential).

Finally a protective circuit triggering circuit is provided for driving the gate terminals of the transistors MP3 and MNC1. This protective circuit triggering circuit possesses, in the preferred illustrated working embodiment, a PMOS transistor MPC1, an NMOS transistor MP2, a resistor R1, an inverter INV1 and a Schottky diode DC1.

The PMOS transistor MPC1 has its source terminal connected with the output AUS. At the gate terminal it gets a reference voltage REF, originating for example from a voltage divider or an already existing voltage source, for example the reference voltage source for a "power on demand" circuit.

The substrate of the PMOS transistor is connected via the Schottky diode DC1 with the first supply potential VCC, said Schottky diode being so placed in circuit that it prevents flow of current toward VCC.

The drain terminal of the PMOS transistor MPC1 is connected with the drain terminal of the NMOS transistor MNC2 which gets the above mentioned enabling signal NCRTL at the gate terminal.

The source terminal of the NMOS transistor NMC2 is connected via the resistor R1 with the second supply potential GND (here ground potential).

A node between the source terminal of the NMOS transistor NMC2 and the resistor R1 is connected with the input terminal of the inverter INV1, whose output terminal for its part constitutes the output terminal S of the driver circuit, said output S being connected with the gate terminals of the transistors MNC1 and MP3.

In the following the operation of the protective circuitry of the invention will be explained in more detail.

Triggering of the protective circuit for limiting the current Iex is dependent on the selection of the reference voltage REF, said voltage being present at the gate terminal of the transistor MPC1. In order for example to ensure that the protective circuit is active for output voltages (VOH) greater than VCC, the reference voltage must be set to a value REF equal to VCC−VtMPC1, VtMPC1 being the threshold voltage of the PMOS transistor MPC1.

This is due to the fact that the PMOS transistor MPC1 turns on when the following relationship (1) is complied with:

$$VOH > REF + VtMPC1 \quad (1)$$

or—after reaching the above value of REF—as expressed by the relationship (2):

$$VOH > VCC \quad (2).$$

If the PMOS transistor MPC1 is switched on in the H state on complying with the relationship (2), the node preceding the inverter INV1 goes to an H level, for in the H state, as mentioned above, the NMOS transistor NMC2 as well is turned on owing to the state of NCTRL being "H".

As a result of this the output terminal S of the triggering circuit for the protective circuit changes to the inverted level, that is to say the L level. Accordingly the PMOS transistor MP3 is turned on and consequently the PMOS transistor MP4 is turned off. Moreover the NMOS transistor MNC1 is turned off. Owing to this situation no further interfering components of the current Iex may flow, for both the current path via the PMOS output transistor MP4 and also the path via the PMOS transistor MP7 are blocked.

The resistor R1 serves in this respect to prevent a freely floating condition of the input terminal of the inverter INV1 in the H state. Owing to its existence there is only a negligible monitoring current component Iex' (of the order microamperes) through the triggering circuit of the protective circuit toward ground via R1. This current component may be set using R1 (typicallly 30 to 50 kΩ) and kept low in accordance with requirements.

More particularly this monitoring current component Iex' is defined by the following relationship (3)

$$Iex' = VOH - (VDSMPCL - VtMNC2)/2 \quad (3).$$

In this relationship VDSMPC1 denotes the drain/source voltage of MPC1, and VtMNC2 is the threshold voltage of MNC2.

This will serve to make clear the one advantage of the NMOS transistor MNC2 that it reduces the voltage at the resistor R1 by VtMNC2 and accordingly contributes to a reduction of the value of the resistor R1. Accordingly the additional space required for the resistor R1 on the chip is marginal.

Furthermore this monitoring current component Iex' will not exist in the L state of the output stage because NCRTL is at "L" and disenabled and accordingly there are no losses.

By way of conclusion the principal functions of the triggering circuit of the protective circuit may be summarized as follows:

a) The voltage VOH is gotten at the output AUS and the monitoring current component Iex' tapped at the output AUS is limited, b) there is a comparison of the voltage VOH at the output AUS with a predetermined reference voltage REF, and c) a triggering signal is supplied in H operation, when the voltage VOH at the output AUS is greater than the reference voltage REF in order accordingly to turn on the PMOS transistor MP3 and to turn off the NMOS transistor MNC1.

The protective circuit of the invention provides effective protection for hybrid VCC driver without substantially increasing the space requirement and without having a disadvantageous effect on the function of the output stage, for example as regards its response behavior.

These properties mean that there is a wide field of application for the protection of load components with low power consumption against overloading so that the working life and reliability thereof may be increased.

I claim:

1. A protective circuit for BiCMOS/CMOS circuitry in hybrid VCC systems during H operation, said BiCMOS/CMOS circuit comprising:

a first MOS transistor (MP4), whose drain terminal is connected with a first supply potential (VCC), whose source terminal constitutes the output (AUS) of the BiCMOS/CMOS circuit and possesses a gate terminal;

a driver circuit (MP1, MP2, Q1, MN2, MN3, D2 and D3), which is connected with the gate terminal of the first MOS transistor (MP4) for selective connection of the gate terminal of the first MOS transistor (MP4) with the first supply potential (VCC) in order to produce an L level at the output (AUS), or with a second supply potential (GND) in order during H operation to produce an H level at the output (AUS); and a second MOS transistor (MP7), whose principal current path is between the output (AUS) and the gate terminal of the first MOS transistor (MP4) and whose gate terminal is connected with a third supply potential (VCC) to short circuit the output (AUS) with the gate terminal of the first MOS transistor (MP4), when the voltage at the output (AUS) exceeds a predetermined value, a third MOS transistor (MP3), whose principal current path is between the first supply potential (VCC) and the gate terminal of the first MOS transistor (MP4) and possesses a gate terminal;

a fourth MOS transistor (MNC1), whose principal current path is in series with the driver circuit (MP1, MP2, Q1, MN2, MN3, D2 and D3) between the gate terminal of the first MOS transistor (MP4) and the second supply potential (GND) and possesses a gate terminal; and a protective circuit triggering circuit (MPC1, DC1, MNC2, R1 and INV1) having a tenth MOS transistor (MPC1) for sensing the voltage at the output, said MOS transistor having its main conduction path coupled to the output and a gate electrode coupled to a reference voltage whereby a magnitude of a monitoring current from the output is limited, said protective circuit triggering circuit comparing voltage (VOH) at the output (AUS) with a predetermined reference voltage (REF), and causing output of a triggering signal during H operation, when the voltage (VOH) at the output (AUS) is larger than the reference voltage (REF) in order so to turn on the third MOS transistor (MP3) and to turn off the fourth MOS transistor (MNC1).

2. The protective circuit as claimed in claim 1, wherein the output (AUS) is connected via the principal current path of a fifth MOS transistor (MP8) with the substrates of the first, second and fifth MOS transistors (MP4, MP7 and MP8), the substrates being coupled to the first supply potential (VCC) and a fourth supply potential (VCC) being present at the gate terminal of the fifth MOS transistor (MP8).

3. The protective circuit as claimed in claim 2, wherein a Schottky diode (D1) is placed between the first supply potential (VCC) and the substrates, such Schottky diode being so placed in circuit that it prevents any flow of current to the first supply potential (VCC).

4. The protective circuit as claimed in claim 1, wherein the driver circuit (MP1, MP2, Q1, MN2, MN3, D2 and D3) comprises: a sixth MOS transistor (MP2), whose principal current path is between the first supply potential (VCC) and the gate terminal of the first MOS transistor (MP4) and which possesses a gate terminal for receiving an input signal (EIN);

seventh and eighth MOS transistors (MN2 and MN3) placed in series with one another, and which are connected with the gate terminal of the first MOS transistor (MP4) and are connected via the fourth MOS transistor (MN1) with the second supply potential (GND), the eighth MOS transistor (MN3) receiving the input signal (EIN) at its gate terminal and the seventh MOS transistor (MN2) receiving an enabling signal (NCTRL) at its gate terminal;

a ninth MOS transistor (MP1), whose principal current path is between the gate terminal of the first MOS transistor (MP4) and the first supply potential (VCC);

and a bipolar transistor (Q1) for shunting the ninth MOS transistor (MP1) in a fashion dependent the complement (CTRL) of the enabling signal (NCTRL) at the base terminal thereof.

5. The protective circuit as claimed in claim 4, wherein between the gate terminal of the first MOS transistor (MP4) and the ninth MOS transistor (MP1) a Schottky diode (D2) is placed, which prevents the flow of current toward the first supply potential (VCC).

6. The protective circuit as claimed in claim 4, wherein between the sixth MOS transistor (MP2) and the gate terminal of the first MOS transistor (MP4) a Schottky diode (D3) is placed which prevents the flow of current toward the first supply potential (VCC).

7. The protective circuit as claimed in claim 1, wherein between the third MOS transistor (MP3) and the gate terminal of the first MOS transistor (MP4) a Schottky diode (D5) is placed which prevents the flow of current toward the first supply potential (VCC).

8. The protective circuit as claimed in claim 1, wherein the protective circuit triggering circuit (MPC1, DC1, MNC2, RI and INV1) further comprises:

an eleventh MOS transistor (MNC2), whose drain terminal is connected with a drain terminal of the tenth MOS transistor (MPC1) and whose gate terminal receives an enabling signal (NCRTL);

a resistor (R1), which is connected with the source terminal of the eleventh MOS transistor (MNC2) and with the second supply potential (GND);

an inverter (INV1), whose input terminal is connected with a node placed between the source terminal of the eleventh MOS transistor (MNC2) and the resistor (R1), and whose output terminal (S) is connected with the gate terminals of the third and of the fourth MOS transistors (MP3 and MNC1).

9. The protective circuit as claimed in claim 8, wherein the substrate of the tenth MOS transistor (MPC1) is connected via a Schottky diode (DC1) with the first supply potential (VCC), said Schottky diode (DC1) being so placed in circuit that it prevents any flow of current toward the first supply potential (VCC).

* * * * *